(12) United States Patent
Kanno et al.

(10) Patent No.: US 7,098,474 B2
(45) Date of Patent: Aug. 29, 2006

(54) ORGANIC ELECTROLUMINESCENT DEVICE HAVING A THIN FILM FORMED BY PLASMA ON A SURFACE OF A HOLE INJECTION LAYER

(75) Inventors: Hiroshi Kanno, Osaka (JP); Kiyoshi Yoneda, Mizuho (JP); Kazuki Nishimura, Hirakata (JP); Yuji Hamada, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/668,609

(22) Filed: Sep. 24, 2003

(65) Prior Publication Data

US 2004/0211956 A1    Oct. 28, 2004

(30) Foreign Application Priority Data

Sep. 27, 2002    (JP)    ............ 2002-284194

(51) Int. Cl.
*H01L 51/00* (2006.01)
*H05B 33/14* (2006.01)

(52) U.S. Cl. ............ 257/40; 257/E51.024; 313/506; 428/690; 428/917

(58) Field of Classification Search ............ 257/40, 257/79, 82, 87–90, 98, E51.024; 313/498, 313/506
See application file for complete search history.

(56) References Cited

U.S. PATENT DOCUMENTS

| | | | |
|---|---|---|---|
| 6,127,004 A * | 10/2000 | Hatwar et al. ............ | 427/535 |
| 6,208,077 B1 | 3/2001 | Hung | |
| 6,541,130 B1 | 4/2003 | Fukuda | |
| 6,551,725 B1 * | 4/2003 | Raychaudhuri et al. ..... | 428/690 |
| 6,558,820 B1 * | 5/2003 | Raychaudhuri et al. ..... | 428/690 |
| 6,565,996 B1 * | 5/2003 | Hatwar et al. ............ | 428/690 |
| 6,579,629 B1 * | 6/2003 | Raychaudhuri et al. ..... | 428/690 |
| 6,670,053 B1 * | 12/2003 | Conley ............ | 428/690 |
| 6,841,267 B1 * | 1/2005 | Brown et al. ............ | 428/690 |
| 6,849,345 B1 * | 2/2005 | Parton et al. ............ | 428/690 |
| 2005/0029932 A1 * | 2/2005 | Yang et al. ............ | 313/504 |
| 2005/0045873 A1 * | 3/2005 | Alvarado et al. ............ | 257/40 |
| 2005/0058853 A1 * | 3/2005 | Cosimbescu et al. ....... | 428/690 |

FOREIGN PATENT DOCUMENTS

| | | |
|---|---|---|
| JP | 289586 B | 3/1999 |
| JP | 11-214157 | 8/1999 |
| JP | P2000-150171 | 5/2000 |
| JP | 2000-323277 | 11/2000 |
| JP | 2001-189192 | 7/2001 |
| JP | 2002-151269 | 5/2002 |
| JP | 2003-249366 | 9/2003 |

* cited by examiner

*Primary Examiner*—Anh Duy Mai
(74) *Attorney, Agent, or Firm*—McDermott Will & Emery LLP

(57) ABSTRACT

A hole injecting electrode composed of ITO is formed on a glass substrate. On the hole injecting electrode, a hole injecting layer composed of CuPc (copper phthalocyanine), a plasma thin film of $CF_x$ formed by plasma CVD, a hole transporting layer of NPB, and a light emitting layer are formed in the order. On the light emitting layer, an electron transporting layer is formed, and an electron injecting electrode is formed thereon.

9 Claims, 8 Drawing Sheets

F I G. 1
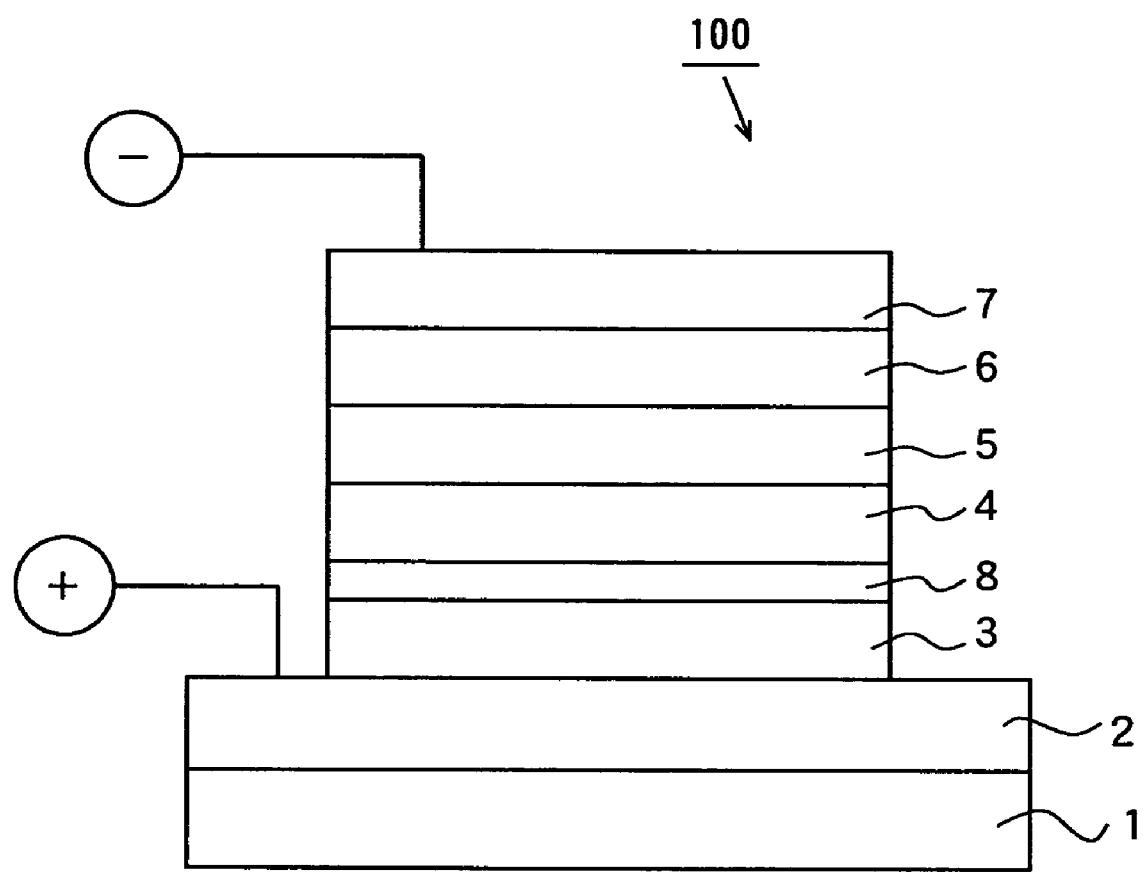

ORGANIC ELECTROLUMINESCENT DEVICE HAVING A THIN FILM FORMED BY PLASMA ON A SURFACE OF A HOLE INJECTION LAYER

BACKGROUND OF THE INVENTION

1. Field of the Invention

The present invention relates to an organic electroluminescent device and a method of fabricating the same 2. Description of the Background Art Organic electroluminescent devices (hereinafter referred to as organic EL devices) are new self-emitting devices of great prospect. Such organic EL devices have a stacked structure in which a carrier transporting layer (an electron transporting layer or a hole transporting layer) and a light emitting layer are formed between a hole injecting electrode and an electron injecting electrode.

As a material of the hole injecting electrode, an electrode material having a large work function such as gold or ITO (indium-tin oxide) is used, whereas as a material of the electron injecting electrode, an electrode material having a small work function such as Mg (magnesium) or Li (lithium) is used.

Moreover, organic materials are used for the hole transporting layer, the light emitting layer, and the electron transporting layer. A material having the property of a p-type semiconductor is used for the hole transporting layer, and a material having the property of an n-type semiconductor is used for the electron transporting layer. The light emitting layer is composed of an organic material having carrier transportability such as electron transportability layer and hole transportability and emitting fluorescence or phosphorescence.

Each functional layer, that is, the hole transporting layer, electron transporting layer, and light emitting layer, can be composed of a plurality of layers, or be omitted, depending on the organic materials used.

In order to improve the operating stability of such organic EL devices, it has been proposed that a CuPc layer (copper phthalocyanine) be interposed between the hole injecting electrode and the hole transporting layer. However, interposing the CuPc layer actually has the disadvantage of increasing the operating voltage. In an attempt to enhance the hole injectability and to improve the operating stability, an organic EL device where a polymer thin film of fluorocarbon synthesized by RF (radio frequency) plasma polymerization method is interposed between the hole injecting electrode and the hole transporting layer has been proposed (e.g. see JP 2000-150171 A).

However, the above conventional organic EL device exhibits degraded heat-resistance due to the interposition of the polymer thin film between the hole injecting electrode and the hole transporting layer.

SUMMARY OF THE INVENTION

An object of this invention to provide an organic electroluminescent device capable of providing improved life time, heat-resistance and yield while maintaining the drive voltage low, and a method of fabricating the same.

An organic electroluminescent device according to one aspect of the invention comprises a hole injecting electrode, a hole injecting layer, a light emitting layer, and an electron injecting electron in this order, and further comprises a thin film formed on a surface of the hole injecting layer on the side of the light emitting layer by plasma treatment.

Note that the thin film may not necessarily be in the form of a layered film formed on the surface of the hole injecting layer, but it may be in the form of islands dispersed thereon.

The organic electroluminescent device of the present invention comprises the thin film formed on the surface of the hole injecting layer on the side of the light emitting layer by plasma treatment, thereby improving the yield while maintaining the drive voltage low. Furthermore, the organic electroluminescent device comprises the hole injecting layer between the hole injecting electrode and the light emitting layer, thereby extending the life time and improving the reliability at high temperature.

As a result, it is possible to improve the life time, the heat-resistance and the yield while maintaining the drive voltage low.

The organic electroluminescent device may further comprise a hole transporting layer between the hole injecting layer and the light emitting layer.

In this case, the drive voltage is not increased even when the thickness of the hole transporting layer on the thin film is increased. Accordingly, it is possible to decrease the number of defective pixels by increasing the thickness of the hole transporting layer. Accordingly, the yield can be improved while the drive voltage is lowered.

The thin film may be formed of a crystalline or non-crystalline material. Furthermore, the thin film may be formed of a material selected from the group consisting of carbon based material, silicon based material, silicon carbide based material, and cadmium sulfide based material. Alternatively, the thin film may be formed of halide. The thin film may be formed of carbon based halide. In particular, the film may be formed of fluorocarbon. Thus, the yield can be further improved while the drive voltage is maintained sufficiently low.

The hole injecting layer may be formed of a material selected from the group consisting of a phthalocyanine compound, porphyrin compound, amine based material, polyaniline based material, polythiophene based material, and polypyrrole based material. Thus, the life time and the heat-resistance can be sufficiently improved.

Preferably, the thickness of the thin film is not less than 5 Å nor more than 50 Å. Thus, a lowered drive voltage, an extended life time, and an improved heat-resistance and an improved yield can be sufficiently attained.

More preferably, the thickness of the thin film is not less than 5 Å nor more than 12 Å. Thus, a lowered drive voltage, an extended life time, an improved heat-resistance and an improved yield can be more sufficiently attained.

The hole injecting layer may be formed of copper phthalocyanine, and the thin film may be formed of fluorocarbon. Thus, the life time and the heat-resistance can be sufficiently improved.

A method of fabricating an organic electroluminescent device according to another aspect of the invention comprises the steps of: forming a hole injecting layer on a hole injecting electrode; plasma-treating an upper surface of the hole injecting layer; and forming sequentially a light emitting layer and an electron injecting electrode on the plasma-treated hole injecting layer.

According to the method of fabricating the organic electroluminescent device of the present invention, the upper surface of the hole injecting layer is plasma-treated, thereby improving the yield while lowering the drive voltage. Furthermore, the hole injecting layer is provided between the hole injecting electrode and the light emitting layer, thereby extending the life time and improving the reliability at high temperature.

As a result, it is possible to improve the life time, the heat-resistance and the yield while maintaining the drive voltage low.

The method of fabricating may further comprise the step of forming the hole transporting layer on the plasma-treated hole injecting layer.

In this case, the hole transporting layer is formed on the plasma-treated hole injecting layer, so that the drive voltage is not increased even when the thickness of the hole transporting layer is increased. Accordingly, it is possible to decrease the number of defective pixels by increasing the thickness of the hole transporting layer. Therefore, the yield can be improved while the drive voltage is lowered.

The step of plasma-treating may include a step of forming a thin film on the hole injecting layer by plasma-treatment. Thus, a lowered drive voltage, an extended life time, an improved heat-resistance and an improved yield can be sufficiently attained.

The step of plasma-treating may include a step of forming a thin film on the hole injecting layer by plasma chemical vapor deposition. Thus, a lowered drive voltage, an extended life time, an improved heat-resistance and an improved yield can be sufficiently attained.

The step of forming a thin film may include a step of forming a thin film composed of a crystalline or non-crystalline material. The step of forming a thin film may include a step of forming a thin film composed of a material selected from the group consisting of carbon based material, silicon based material, silicon carbide based material, and cadmium sulfide based material. The step of forming a thin film may include a step of forming a thin film composed of a halide. Thus, the yield can be further improved while the drive voltage is maintained sufficiently low.

The step of forming a hole injecting layer may include a step of forming a hole injecting layer of a material selected from the group consisting of a phthalocyanine compound, porphyrin compound, amine based material, polyaniline based material, polythiophene based material, and polypyrrole based material. Thus, the life time and the heat-resistance can be sufficiently improved.

The step of forming a hole injecting layer may include a step of forming the hole injecting layer of copper phthalocyanine, and the step of forming a thin film may include a step of forming the thin film of fluorocarbon. Thus, the life time and the heat-resistance can be sufficiently improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic diagram showing the structure of an organic EL device according to one embodiment of the present invention.

DESCRIPTION OF THE PREFERRED EMBODIMENTS

Figure 2:
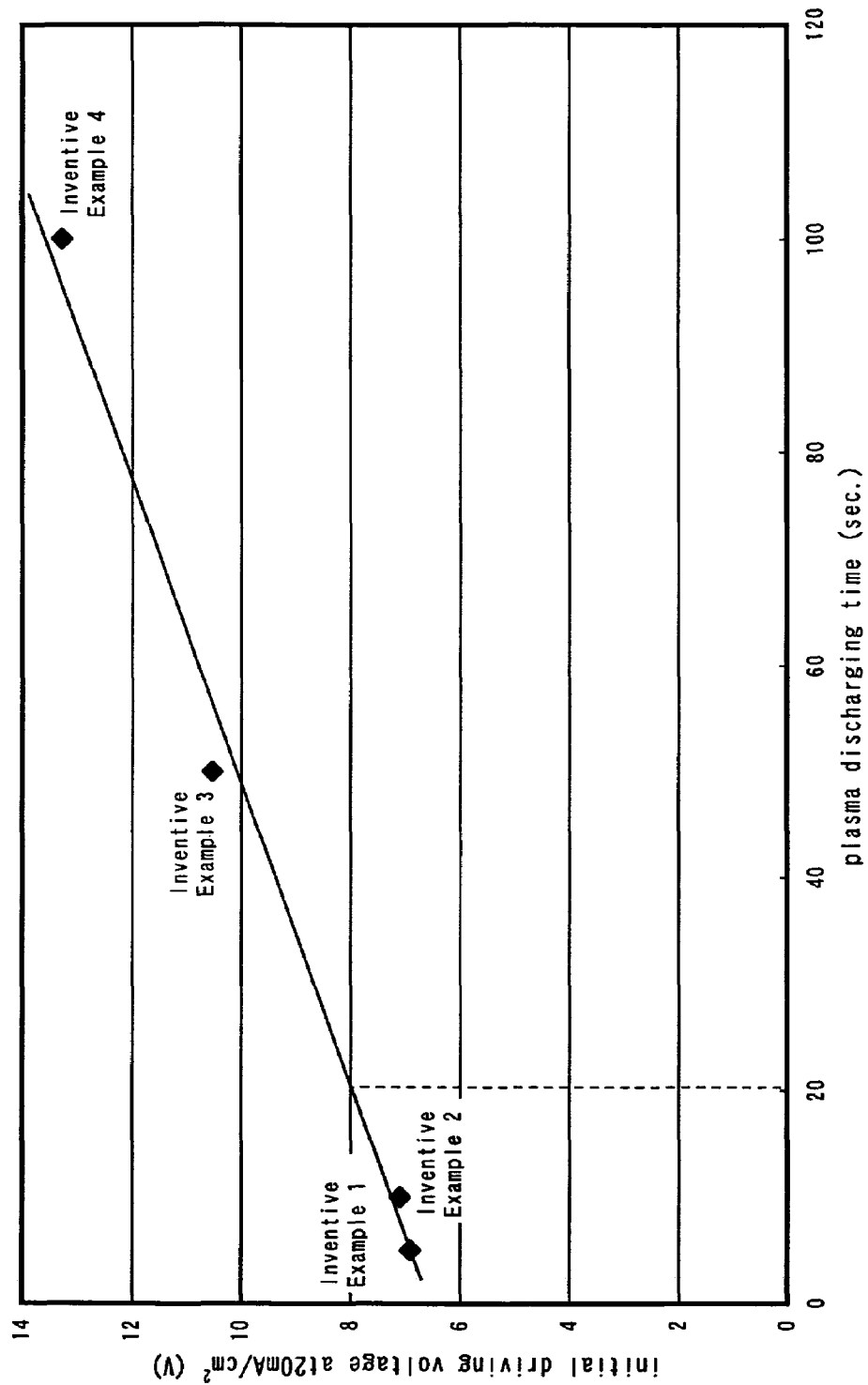
FIG. 2 is a diagram showing the relationship between the plasma discharging time and the initial drive voltage at 20 mA/m$^2$ during formation of plasma thin films in the organic EL devices of Inventive Examples 1–4.

FIG. 1 is a schematic diagram showing the structure of an organic electroluminescent device (hereinafter referred to as an organic EL device) according to one embodiment of the present invention.

As shown in FIG. 1, in an organic EL device 100, a hole injecting electrode (anode) 2 composed of a transparent electrode film is formed on a glass substrate 1. On the hole injecting electrode 2, a hole injecting layer 3 composed of an organic material, a thin film 8 formed by plasma CVD (plasma chemical vapor deposition) (hereinafter referred to as a plasma thin film), a hole transporting layer 4 composed of an organic material, and a light emitting layer 5 composed of an organic material are formed in the order. Furthermore, on the light emitting layer 5, an electron transporting layer 6 composed of an organic material is formed, and an electron injecting electrode (cathode) 7 is formed thereon.

The hole injecting electrode (anode) 2 is composed of, for example, indium-tin oxide (ITO). The hole injecting layer 3 is composed of, for example, CuPc (copper phthalocyanine). The plasma thin film 8 is composed of, for example, $CF_x$ (fluorocarbon).

The hole transporting layer 4 is composed of, for example, N,N'-Di(naphthalen-1-yl)-N,N'-diphenyl-benzidine (hereinafter referred to as NPB) having a molecular structure expressed by Formula (1):

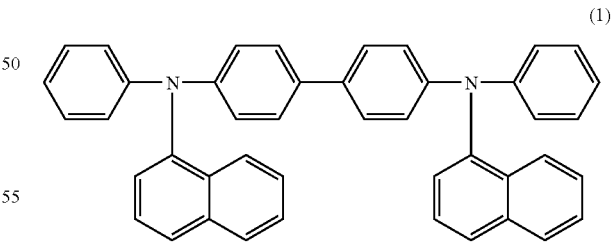

(1)

The light emitting layer 5 contains, for example, as a host material, Tris(8-hydroxyquinolinato) aluminum (hereinafter referred to as Alq) having a molecular structure expressed by Formula (2), and contains, as a dopant, tert-butyl substituted dinaphthylanthracene (hereinafter referred to as TBADN) having a molecular structure expressed by Formula (3), and 3,4-Difuluoro-N,N'-Dimethyl-quinacridone (hereinafter referred to as CFDMQA) having a molecular structure expressed by Formula (4).

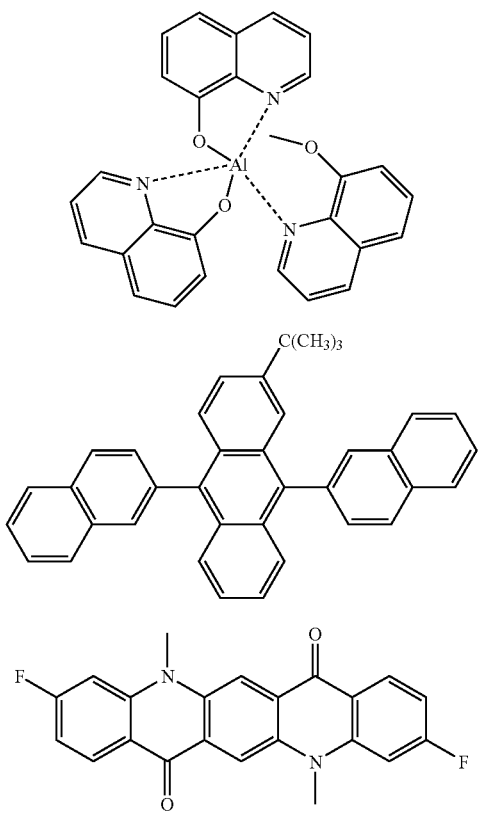

The electron transporting layer 6 is composed of, for example, Alq. The electron injecting electrode 7 has a laminated structure of, for example, a LiF film and an Al film.

In the above-described organic EL device 100, a voltage is applied between the hole injecting electrode 2 and the electron injecting electrode 7 to cause the light emitting layer 5 to emit green light, which is emitted from the back surface of the glass substrate 1.

In the organic EL device 100 of the present embodiment, the hole injecting layer 3 composed of CuPc is interposed between the hole injecting electrode 2 and the hole transporting layer 4, and the plasma thin film 8 of $CF_x$ is formed between the hole injecting layer 3 and the hole transporting layer 4. With this structure, it becomes possible to improve the heat-resistance (reliability at high temperature) and extend the life while keeping the drive voltage low, and to decrease the number of defective pixels to attain the improved yield.

The structure of the organic EL device of the present invention can be replaced by various other structures without being limited to the one shown above. For example, an electron injecting layer may be provided between the electron transporting layer 6 and the electron injecting electrode 7.

Various known polymer materials can be used as a material of the light emitting layer 5. In this case the hole transporting layer 4 does not have to be provided.

While in the aforementioned embodiment, CuPc is used as a material for the hole injecting layer 3, it is not exclusive in this invention, and one of conductive polymer materials composed of hole transmissive compounds which has the function of transmitting holes injected from the hole injecting electrode 2 to the light emitting layer 5 may also be used. Further, as a material of the hole injecting layer 3, hole injecting porphyrin compounds, phthalocyanine compounds, hole transporting aromatic tertiary amine, trisphenothiazinyltriphenylamine derivatives or triphenoxazinyltriphenylamine derivatives, polythiophene, and compounds containing a carbazole group may be used. Alternatively, triazole compounds, oxadiazole derivatives, imidazole derivatives, polyallylalkane derivatives, pyrazoline derivatives, pyrazolone derivatives, phenylenediamine derivatives, allylamine derivatives, oxazole derivatives, styrylanthracene derivatives, fluorene derivatives, hydrazone derivatives, stilbeme derivatives, porphyrin compounds, aromatic tertiary amine compounds, styrylamine compounds, butadiene compounds, polystyrene derivatives, hydrazone derivatives, tryphenylmethane derivatives, tetraphenylbenzidine dereivatives, polyaniline based high-molecular materials, polythiophene based high-molecular materials, polypyrrole based high-molecular materials and the like can be used. In particular, it is preferred to use porphyrin compounds, aromatic tertiary amine compounds, and styrylamine compounds, and further preferred to use a material whose ionization energy is greater than 4.5 eV.

While $CF_x$ is used as a material of the plasma thin film 8, it is not exclusive in this invention, and non-crystalline or crystalline inorganic materials of C-based, Si-based, SiC-based, CdS-based, or the like may also be used. A C-based halide or Si-based halide may also be used. Furthermore, as a material of the plasma thin film 8, rare-earth fluorides containing a rare-earth element selected from the group consisting of Ce, Pr, Nd, Sm, Eu, Gd, Tb, Dy, Ho, Er, Tm, and Yb, transition-metal fluorides containing a transition metal selected from the group consisting of Ti, V, Cr, Mn, Fe, Co, Ni, and Cu, or the like may be used.

While in the aforementioned embodiment, the plasma thin film 8 is formed between the hole injecting layer 3 and the hole transporting layer 4, a thin film may be formed between a hole transporting layer and a light emitting layer by plasma treatment. For example, the plasma thin film 8 composed of $CF_x$ may be formed between the hole transporting layer 4 and the light emitting layer 5. Alternatively, a thin film may be formed between the light emitting layer and the electron transporting layer by plasma treatment. Moreover, in an organic EL device where an electron injecting layer is provided on an electron transporting layer, a thin film may be formed between the electron transporting layer and the electron injecting layer by plasma treatment, or a thin film may be formed between the electron injecting layer and an electron injecting electrode by plasma treatment. Also in these cases, the same effect as that of the aforementioned embodiment can be obtained.

Furthermore, while in the aforementioned embodiment the thin film is formed by plasma CVD as plasma-treatment, the surface of the hole injecting layer 3 may only be subjected to a plasma atmosphere.

For example, the surface of the hole injecting layer 3 may be plasma-treated in an oxygen atmosphere. Alternatively, the surface of the hole injecting layer 3 may be plasma-treated in a mixed gas atmosphere of oxygen and argon. In both of these cases, oxygen is absorbed or reacted on the surface of the hole injecting layer 3 composed of CuPc, which causes the increased hole mobility, or the decreased energy barrier at the interface when holes are injected.

EXAMPLES

Organic EL devices of Inventive Examples and comparative Examples were fabricated, and luminescence characteristics of these devices were measured.

The organic EL devices of Inventive Examples 1–5 were fabricated as follows. A hole injecting electrode (anode) 2 composed of indium-tin oxide (ITO) was formed on a glass substrate 1, and was subjected to an oxygen plasma-treatment. A hole injecting layer 3 composed of CuPc with a thickness of 100 Å was then formed on the hole injecting electrode 2 by vacuum vapor deposition.

A plasma thin film 8 composed of $CF_x$ was subsequently formed on the hole injecting layer 3 by plasma CVD. The plasma discharging time of plasma CVD was set to five seconds in Inventive Example 1, it was set to 10 seconds in Inventive Examples 2 and 5, it was set to 50 seconds in Inventive Example 3, and it was set to 100 seconds in Inventive Example 4. Considering the result of another experiment that will be described below, it was presumed that the thickness of the plasma thin film 8 was 6 Å in Inventive Example 1, 12 Å in Inventive Examples 2 and 5, 50 Å in Inventive Example 3, and 66 Å in Inventive Example 4.

Furthermore, a hole transporting layer 4 composed of NPB with a thickness of 1900 Å was formed on the plasma thin film by vacuum vapor deposition, and a light emitting layer 5 with the thickness of 280 Å was formed on the hole transporting layer 4 by vacuum vapor deposition. The light emitting layer 5 contains Alq as a host material, and contains, as a dopant, TBADN of 20 wt. % (70 Å), and CFDMQA of 0.7 wt. %.

On the light emitting layer 5, an electron transporting layer 6 composed of Alq with a thickness of 350 Å was then formed by vacuum vapor deposition. Finally, an electron injecting electrode (cathode) 7 composed of a LiF film with a thickness of 10 Å and an Al film with a thickness of 2000 Å were formed on the electron transporting layer 6 by vacuum vapor deposition.

The organic EL devices of Inventive Examples 1–5 were thus fabricated. The organic EL device of Inventive Example 5 was fabricated in the same conditions as those of Inventive Example 2 in order to assure the repeatability of characteristics of the device.

The organic EL device of Comparative Example 1 was fabricated in the same manner as Inventive Examples 1–5 except that the plasma thin film 8 composed of $CF_x$ was not formed, and the thickness of the hole transporting layer 4 composed of NPB was different. The thickness of the hole transporting layer 4 of NPB was 500 Å.

The organic EL device of Comparative Example 2 was fabricated in the same manner as Inventive Example 2 except that the hole injecting layer 3 composed of CuPc was not formed.

In Comparative Example 3, a plasma thin film composed of $CF_x$ was formed between the hole injecting electrode 2 and the hole injecting layer 3, and the plasma thin film 8 composed of $CF_x$ was not formed between the hole injecting layer 3 and the hole transporting layer 4. Namely, in the Comparative Example 3, the hole injecting electrode 2 on the glass substrate 1 was likewise treated in an oxygen plasma as shown in Inventive Examples 1–5, and then the plasma thin film composed of $CF_x$ was formed on the hole injecting electrode 2 by plasma CVD. The plasma discharging time of plasma CVD was set to 10 seconds. In this case, it was presumed that the thickness of the plasma thin film was 12 Å.

Table 1 shows the formation procedures and conditions of each layer of the organic EL devices of Inventive Examples 1–5 and Comparative Examples 1–3.

TABLE 1

| | oxygen plasma treatment | plasma thin film $CF_x$ (Å) | hole injection layer CuPc (Å) | plasma thin film $CF_x$ (Å) | hole injection layer NPB (Å) | light emitting layer Alq (Å) | light emitting layer TBADN (Å) | light emitting layer CFDMQA | electron transporting layer Alq (Å) | cathode LiF/Al (Å) |
|---|---|---|---|---|---|---|---|---|---|---|
| Comparative Example 1 | ① | — | ② 100 | — | ③ 500 | 280 | 70 Å | 0.7% | 350 | 10/2000 |
| Inventive Example 1 | ① | — | ② 100 | ③ 5 sec. (6 Å) | ④ 1900 | 280 | 70 Å | 0.7% | 350 | 10/2000 |
| Inventive Example 2 | ① | — | ② 100 | ③ 10 sec. (12 Å) | ④ 1900 | 280 | 70 Å | 0.7% | 350 | 10/2000 |
| Inventive Example 3 | ① | — | ② 100 | ③ 50 sec. (50 Å) | ④ 1900 | 280 | 70 Å | 0.7% | 350 | 10/2000 |
| Inventive Example 4 | ① | — | ② 100 | ③ 100 sec. (66 Å) | ④ 1900 | 280 | 70 Å | 0.7% | 350 | 10/2000 |
| Inventive Example 5 | ① | — | ② 100 | ③ 10 sec. (6 Å) | ④ 1900 | 280 | 70 Å | 0.7% | 350 | 10/2000 |
| Comparative Example 2 | ① | — | — | ② 10 sec. (6 Å) | ③ 1900 | 280 | 70 Å | 0.7% | 350 | 10/2000 |
| Comparative Example 3 | ① | ② 10 sec. (12 Å) | ③ 100 | — | ④ 1900 | 280 | 70 Å | 0.7% | 350 | 10/2000 |

In Table 1, ①–④ show the sequence of process. As shown in Table 1, in Comparative Example 1, only a hole injecting layer 3 composed of CuPc was formed between the hole injecting electrode 2 and the hole transporting layer 4. In Inventive Examples 1–5, the hole injecting layer 3 composed of CuPc and the plasma thin film 8 of $CF_x$ were sequentially formed between the hole injecting electrode 2 and the hole transporting layer 4. In Comparative Example 2, only the plasma thin film 8 of $CF_x$ was formed between the hole injecting electrode 2 and the hole transporting layer 4. In Comparative Example 3, the plasma thin film of $CF_x$ and the hole injecting layer 3 of CuPc were sequentially formed between the hole injecting electrode 2 and the hole transporting layer 4.

Table 2 shows the conditions of oxygen plasma-treatment and the conditions of forming the plasma thin film 8 composed of $CF_x$.

TABLE 2

| | conditions | | | | |
|---|---|---|---|---|---|
| | pressure (Pa) | gas | flow rate (sccm) | treatment time (sec) | RF Power (W) |
| oxygen plasma-treatment | 2.0 | $O_2$ | 200 | 180 | 200 |
| plasma thin film CFx | 7 | $CHF_3$ | 100 | 5 | 100 |
| | | | | 10 | |
| | | | | 50 | |
| | | | | 100 | |

Table 3 shows the conditions of forming the hole injecting layer 3, the hole transporting layer 4, the light emitting layer 5, the electron transporting layer 6, and the electron injecting electrode (cathode) 7.

TABLE 3

| | | conditions | | | | |
|---|---|---|---|---|---|---|
| | | pressure (Pa) | heater temperature (° C.) | deposition speed (Å/sec) | thickness (Å) | amount of doping (%) |
| hole injection layer | CuPc | $10^{-5}$ | 425 | 0.74 | 100 | — |
| hole transporting layer | NPB | 1.0 | — | 3.52 | 500 1900 | — |
| light emitting layer | Alq | $10^{-5}$ | 305 | 7.13 | 280 | — |
| | TBADN | — | 220 | 2.64 | 70 | — |
| | CFDMQA | — | 210 | 0.66 | — | 0.7 |
| electron transporting layer | Alq | — | 310 | 10.55 | 350 | — |
| cathode | LiF | $10^{-5}$ | 560 | 0.2 | 10 | — |
| | Al | $10^{-5}$ | — | 15 | 2000 | — |

With the organic EL devices of Inventive Examples 1–5 and Comparative Inventive Examples 1–3, the initial drive voltages at 20 mA/cm$^2$, CIE chromaticity coordinates, and luminescence efficiencies were measured. Table 4 shows the result of measurement.

TABLE 4

| | initial driving voltage (V) | CIE chromaticity coordinates (x, y) | luminescence efficiency (cd/A) |
|---|---|---|---|
| Comparative Example 1 | 10.2 | (0.33, 0.92) | 7.27 |
| Inventive Example 1 | 6.92 | (0.31, 0.62) | 7.19 |
| Inventive Example 2 | 7.11 | (0.31, 0.62) | 7.21 |
| Inventive Example 3 | 10.52 | (0.31, 0.62) | 7.23 |
| Inventive Example 4 | 13.28 | (0.31, 0.62) | 6.98 |
| Inventive Example 5 | 7.49 | (0.30, 0.65) | 7.21 |
| Comparative Example 2 | 12.69 | (0.34, 0.61) | 4.9 |
| Comparative Example 3 | 12.50 | (0.34, 0.61) | 4.78 |

As shown in Table 4, the initial drive voltages of Inventive Examples 1, 2, 3 and 5, and Comparative Example 1 are lower than 11 volts, and in particular, the initial drive voltages of Inventive Examples 1, 2 and 5 are lower than 8 volts. Furthermore, the organic EL devices of Inventive Examples 1–5 and Comparative Example 1 provide a high luminescence efficiency of not less than about 7 cd/A.

FIG. 2 and Table 5 show the relationship between the plasma discharging time and the initial drive voltage at 20 mA/cm$^2$ during formation of the plasma thin film 8 in Inventive Examples 1–4.

TABLE 5

| plasma discharging time (sec) | initial driving voltage (V) at 20 mA/cm$^2$ |
|---|---|
| 5 | 6.92 |
| 10 | 7.11 |

TABLE 5-continued

| plasma discharging time (sec) | initial driving voltage (V) at 20 mA/cm$^2$ |
|---|---|
| 50 | 10.52 |
| 100 | 13.28 |

As shown in FIG. 2 and Table 5, it is seen that the initial drive voltage becomes lower than 11 volts by setting the plasma discharging time to not more than 50 seconds, the initial drive voltage becomes not higher than 10 volts by setting the plasma discharging time to not more than 48 seconds, the initial drive voltage becomes not higher than 8 volts not more than 20 seconds, the initial drive voltage becomes not higher than 7.2 volts by setting the plasma discharging time to not more than 10 seconds, and the initial drive voltage becomes not higher than 7 volts by setting the plasma discharging time to 5 seconds. In active matrix organic EL display devices, a voltage applied to a TFT (thin film transistor) is about 6 to about 8 volts. Therefore, in order to reduce the drive voltage, it is preferable to set the plasma discharging time to not more than 50 seconds, more preferable to not more than 20 seconds, still more preferable to not more than 10 seconds, and most preferable to 5 seconds.

Considering the relationship between the plasma discharging time and the thickness of the plasma thin film 8 composed of $CF_x$ that will be described below, in order to decrease the drive voltage, the thickness of the plasma thin film 8 is preferably not more than 45 Å, more preferably not more than 24 Å, still more preferably not more than 12 Å, and most preferably 5 Å to 6 Å.

Figure 3:
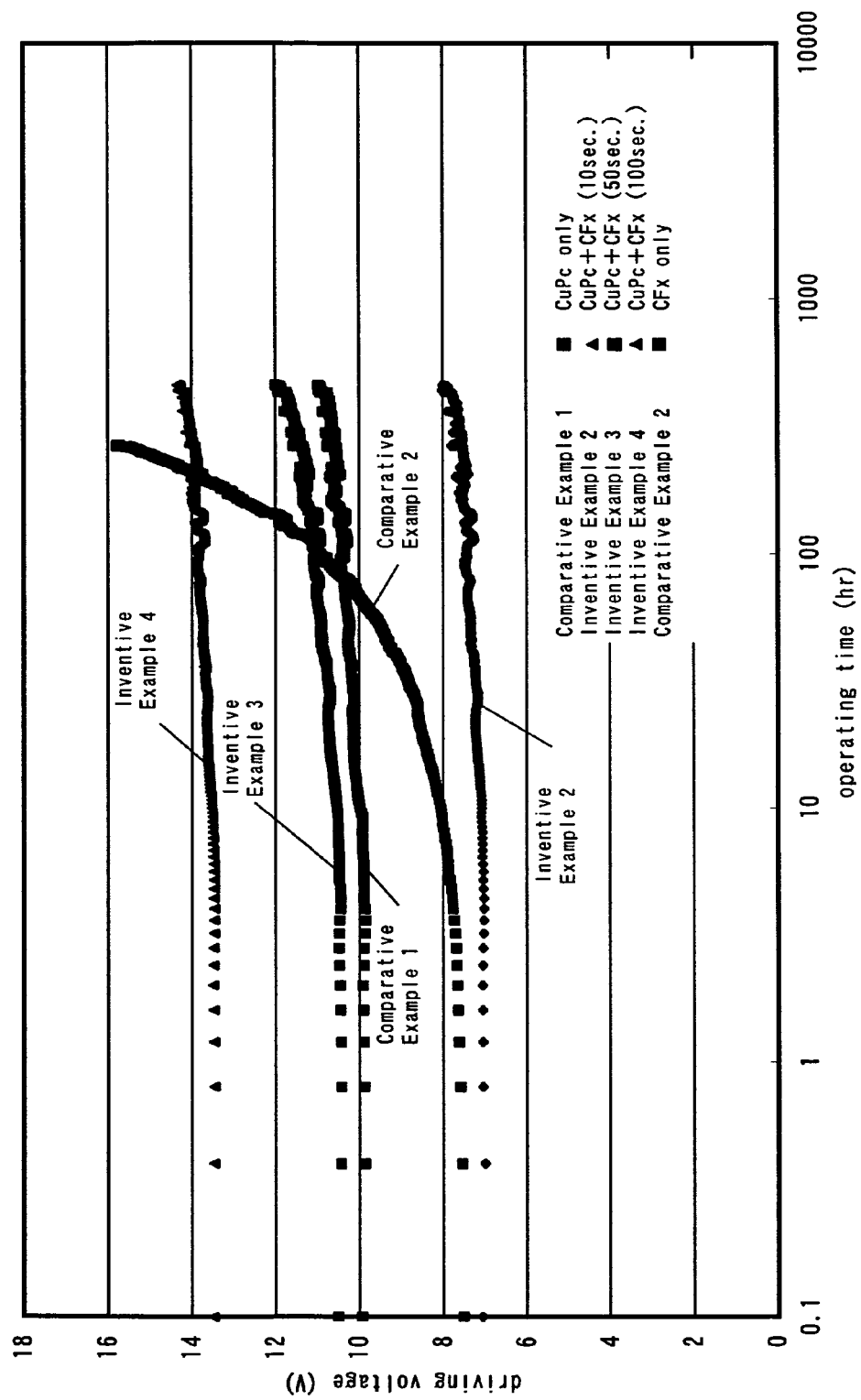
FIG. 3 is a diagram showing the variations with time of drive voltages of the organic EL devices of Inventive Examples 2, 3 and 4, and Comparative Examples 1 and 2.

The variations with time of drive voltages of the organic EL devices of Inventive Examples 2, 3 and 4, and Comparative Inventive Examples 1 and 2 were then measured. FIG. 3 is a diagram showing the variations with time of drive voltages of Inventive Examples 2, 3 and 4, and Comparative Examples 1 and 2. Here, a current was adjusted so that the initial luminance was 1500 cd/m$^2$ in order to examine the variations with time of drive voltages.

As shown in FIG. 3, in Inventive Examples 2, 3 and 4, and Comparative Example 1, the drive voltages only a slight increase, and maintain a high operating stability. Furthermore, in Inventive Examples 2 and 3, and Comparative Example 1, the operating voltages are kept low, and in Inventive Example 2, in particular, the voltage is kept lowest. In the organic EL device of Comparative Example 1, on the other hand, while the drive voltage is initially low, it began to increase in a short operating time. The result shows that the drive voltage can be kept low by forming the hole injecting layer 3 composed of CuPc, or forming the hole injecting layer 3 of CuPc and the plasma thin film 8 of $CF_x$ with a thickness of not more than 45 Å. In particular, it is seen that the drive voltage can be kept sufficiently low by forming the hole injecting layer 3 composed of CuPc and the plasma thin film 8 of $CF_x$ with a thickness of not more than 12 Å.

Note that where only the hole injecting layer 3 of CuPc is formed, the drive voltage is increased by making the thickness of the hole transporting layer 4 composed of NPB large. It is thus necessary to decrease the thickness of the hole transporting layer 4 of NPB to not more than 500 Å as that of Comparative Example 1. In this case, defective pixels increase, and the yield is degraded, as will be described below.

Therefore, in order to keep the drive voltage low in a long period, it is preferable to form the hole injecting layer 3 composed of CuPc, and the plasma thin film 8 of $CF_x$ with a thickness of not more than 50 Å.

Figure 4:
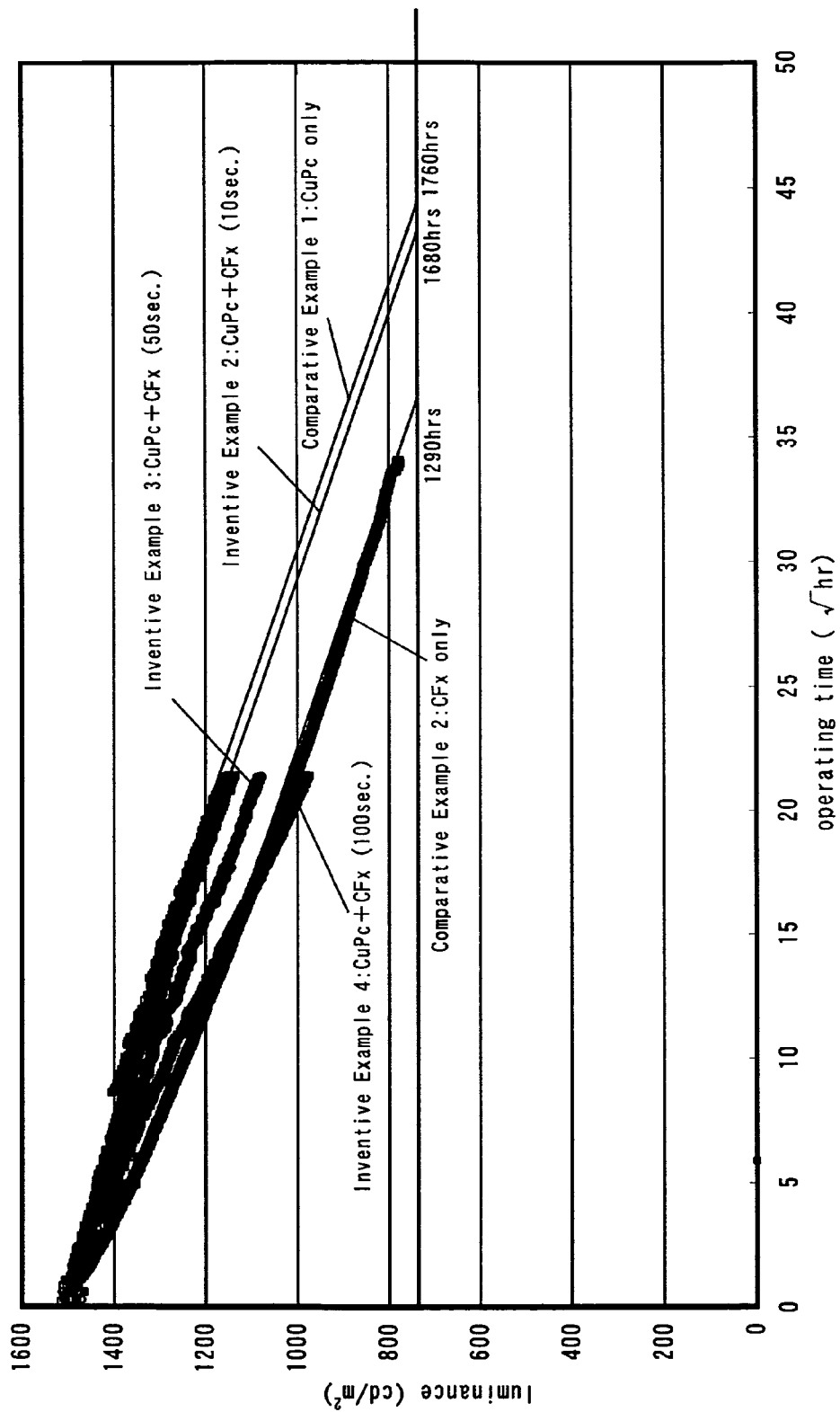
FIG. 4 is a diagram showing the variations with time of luminances of the organic EL devices of Inventive Examples 2, 3 and 4, and Comparative Examples 1 and 2.

The organic EL devices of Inventive Examples 2, 3 and 4, and Comparative Inventive Examples of 1 and 2 were then measured for their reliabilities at room temperature (life time). FIG. 4 is a diagram showing the variations with time of luminance of the devices of Inventive Examples 2, 3 and 4, and Comparative Inventive Examples 1 and 2. Here, a current was adjusted so that the initial luminance was 1500 cd to examine the variations with time of luminance.

The life time here represents the operating time from the beginning of the operation to the time that the luminance was reduce to half. As shown in FIG. 4, the life time of the organic EL device of Comparative Example 1 was the longest of 1760 hours, and the life time of the organic EL device of Comparative Example 2 was the second longest of 1680 hours. The life time of Comparative Example 2, on the other hand, was as short as 1290 hours.

It is seen from this result that the life time can be increased by forming the hole injecting layer 3 composed of CuPc, or forming the hole injecting layer 3 of CuPc and the plasma thin film 8 of $CF_x$ with an thickness of not more than 45 Å.

Note that, as described before, where only the hole injecting layer 3 composed of CuPc is formed, it is necessary to make the thickness of the hole transporting layer 4 composed of NPB small to suppress an increase in the drive voltage. In this case, defective pixels increase, and the yield is degraded, as will be described below.

Therefore, in order to increase the life time, it is preferable to form the hole injecting layer 3 composed of CuPc and the plasma thin film 8 of $CF_x$ with a thickness of not more than about 50 Å.

The organic EL devices of Inventive Example 2, and Comparative Examples 1 and 2 were subsequently measured for the reliabilities at high temperature (heat-resistance).

Figure 5:
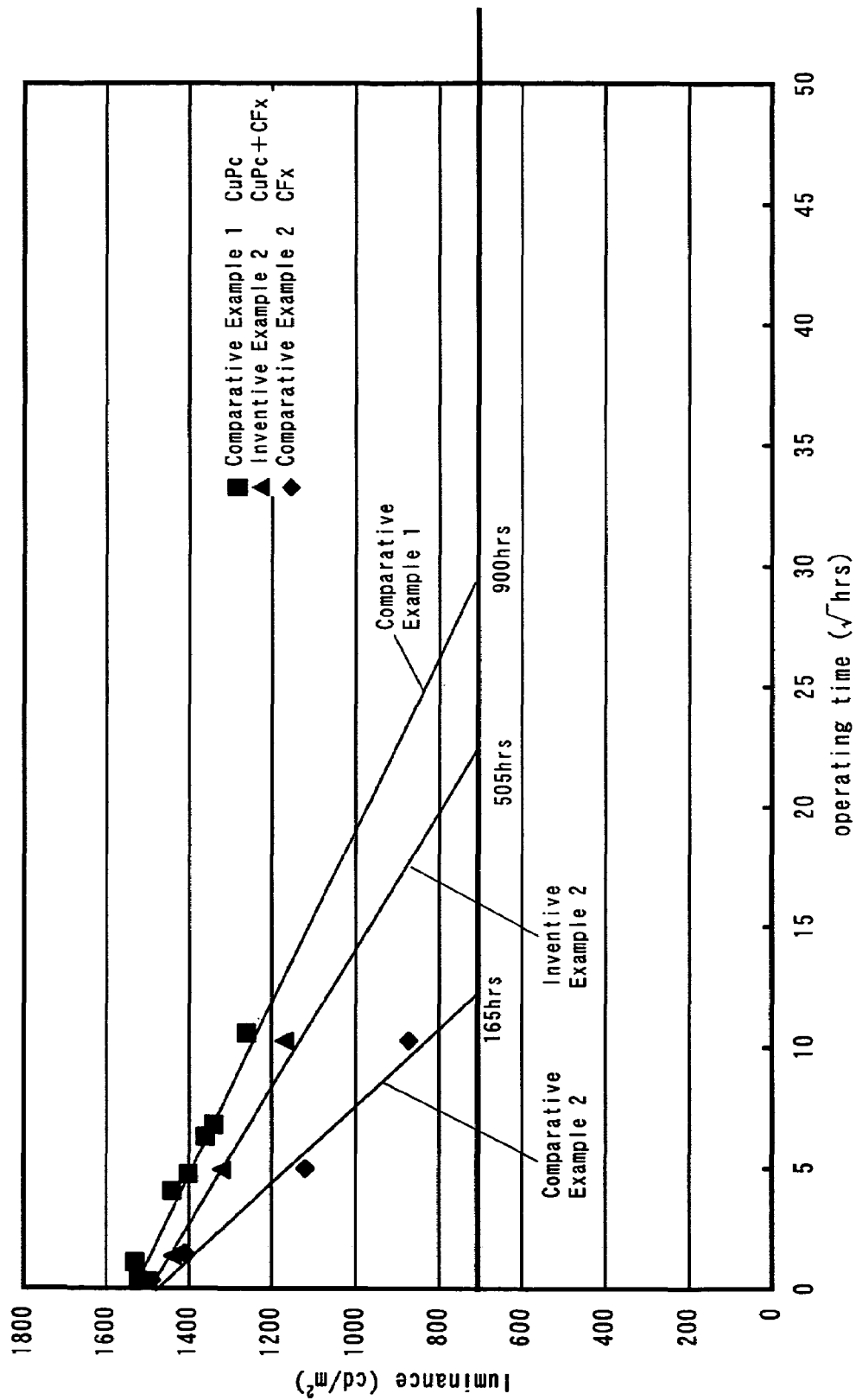
FIG. 5 is a diagram showing the variations with time of luminances at a temperature of 60° C. of the organic EL devices of Inventive Example 2, and Comparative Examples 1 and 2.

FIG. 5 is a diagram showing the variations life time of luminance of the devices of Inventive Example 2 and Comparative Examples 1 and 2 at a temperature of 60° C. Here, a current was adjusted so that the initial luminance was 1500 cd/m$^2$ in order to examine the variations with time of luminance.

The life time here represents the operating time from the beginning of the operation to the time that the luminance was reduce to half. As shown in FIG. 5, the life time of the organic EL device of Comparative Example 1 was the longest of 900 hours, and the life time of the organic EL device of Example 2 was the second longest of 505 hours. The life time of the organic EL device of Comparative Example 2, on the other hand, was as short as 165 hours.

It is seen from this result that the reliability at high temperature (heat-resistance) can be improved by forming the hole injecting layer 3 composed of CuPc, or forming the hole injecting layer 3 of CuPc and the plasma thin film 8 of $CF_x$.

Note that, as described before, where only the hole injecting layer 3 composed of CuPc is formed, it is necessary to make the thickness of the hole transporting layer 4 small to suppress an increase in the drive voltage. In this case, defective pixels increase, the yield is degraded, as will be described below.

Therefore, in order to increase the reliability at high temperature (heat-resistance), it is preferable to form the hole injecting layer 3 composed of CuPc, and the plasma thin film 8 of $CF_x$ with an thickness of not more than 12 Å.

Figure 6:
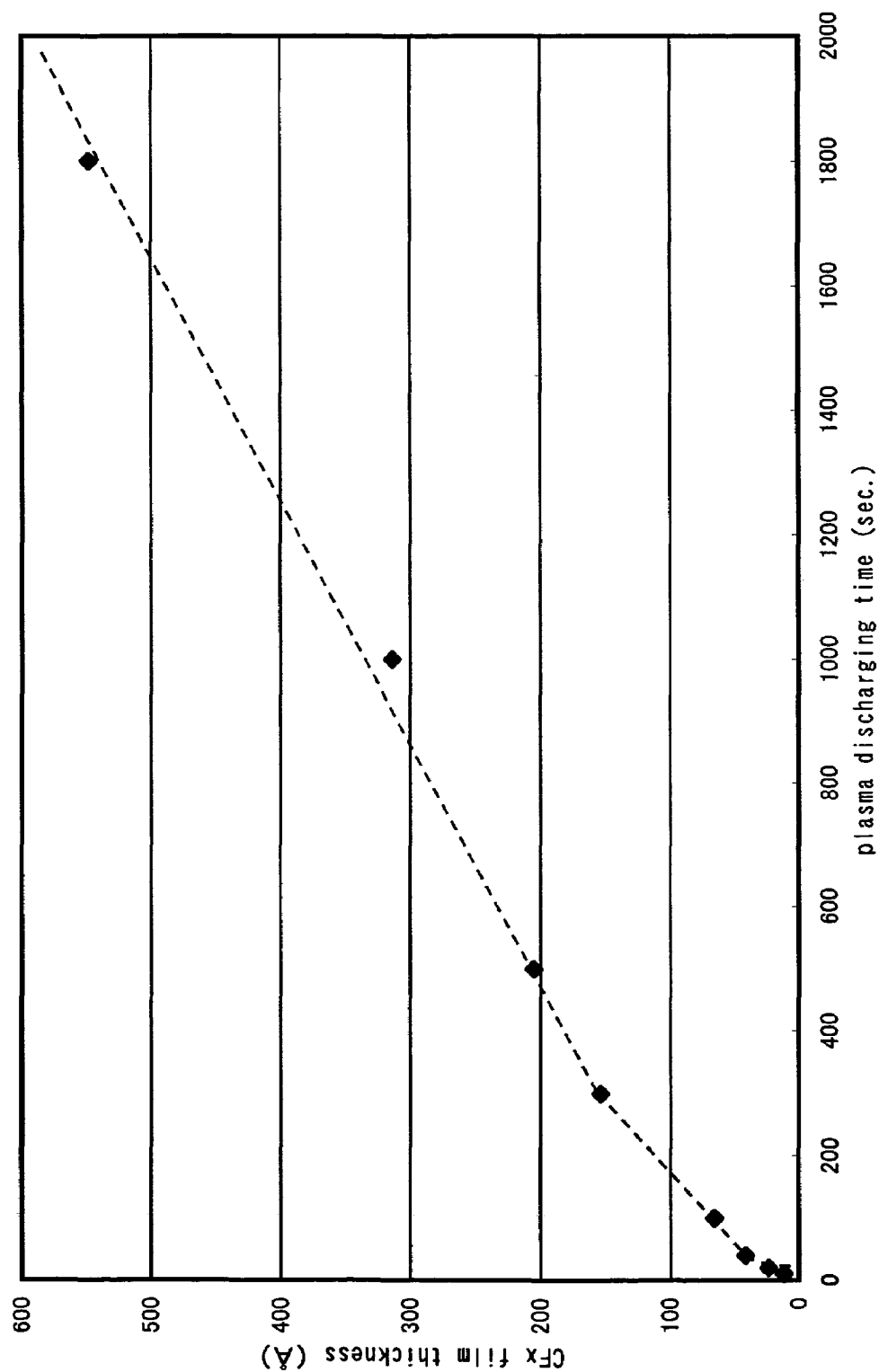
FIG. 6 is a diagram showing the result of measurement of the relationship between the plasma discharging time in plasma CVD and the thickness of $CF_x$ film.

The relationship between the plasma discharging time of plasma CVD and the thickness of $CF_x$ was next measured. FIG. 6 and Table 6 show the result of measurement of the relationship between the plasma discharging time of plasma CVD and the thickness of $CF_x$.

TABLE 6

| plasma discharging time (sec) | CFx film thickness (Å) |
|---|---|
| 10 | 12 |
| 20 | 24 |
| 40 | 42 |
| 100 | 66 |
| 300 | 154 |
| 500 | 205 |
| 1000 | 314 |
| 1800 | 548 |

The $CF_x$ film was formed under the conditions of a pressure of 7 Pa, a $CHF_3$ gas flow rate of 100 sccm, and a RF power of 100 W. The frequency of RF power was 13.56 MHz. The distance between the electrodes disposed as parallel plate, and the distance between the electrode and the substrate were about 75 mm.

FIG. 6 and Table 6 show that the deposition rate is high during the initial period of the film formation. This may be because during the initial period of plasma generation (initial period of breakdown) discharging state is more intense than that during the stable period.

It is found that in Inventive Example 1, the thickness of the plasma thin film 8 composed of $CF_x$ formed for a plasma discharging time of 5 seconds was 5–6 Å, and in Inventive Examples 2 and 5, and Comparative Example 2, the thickness of the plasma thin film 8 composed of $CF_x$ formed for a plasma discharging time of 10 seconds was 12 Å. Furthermore, in Inventive Example 3, the thickness of the plasma thin film 8 composed of $CF_x$ formed for a plasma discharging time of 50 seconds was 45 Å, and in Inventive Example 4, the thickness of the plasma thin film 8 composed of $CF_x$ formed for a plasma discharging time of 100 seconds was 66 Å.

Figure 7:
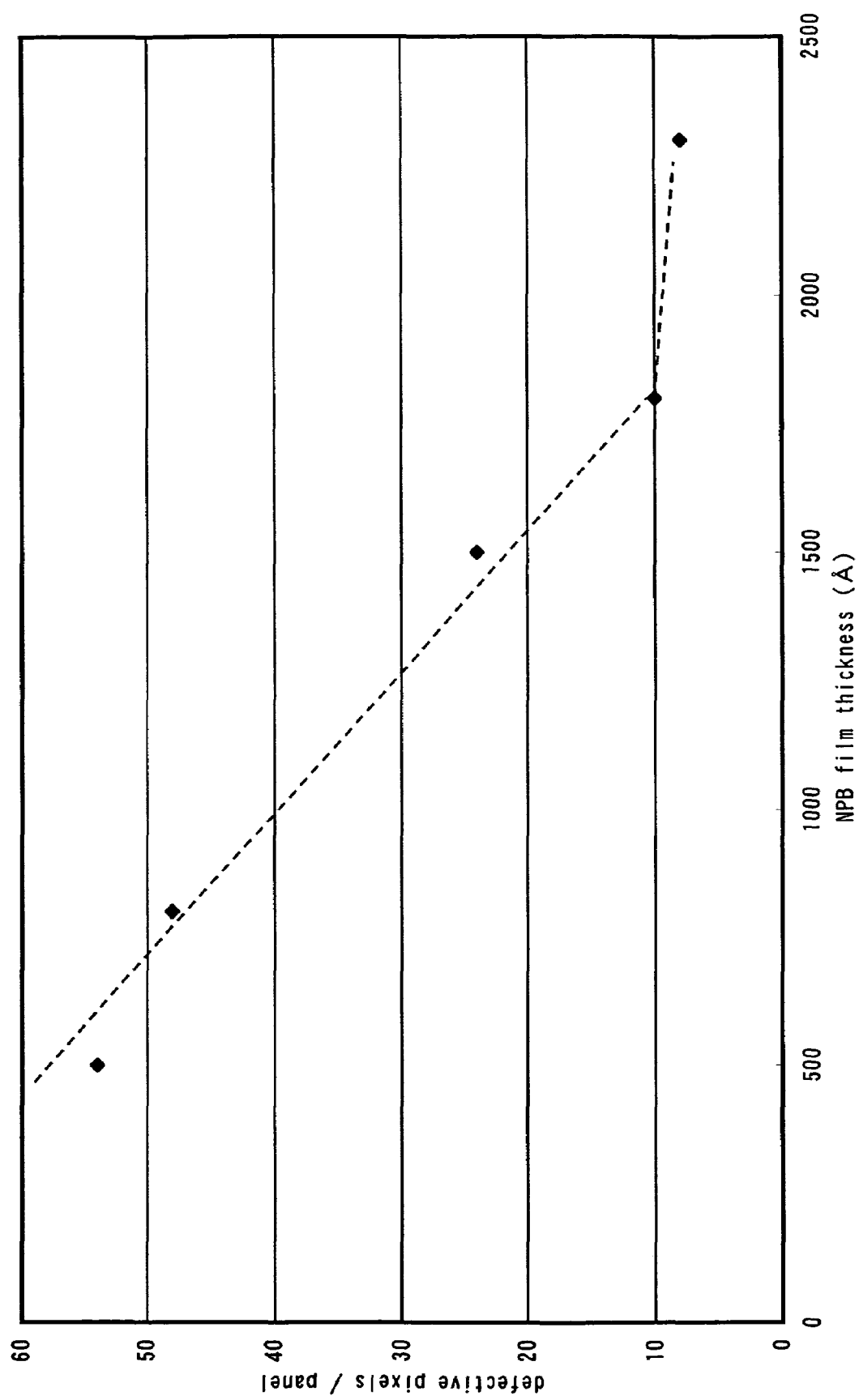
FIG. 7 is a diagram showing the relationship between the thickness of a hole transporting layer composed of NPB and the number of defective pixels in the organic EL device of Inventive Example 2.

Next, with the organic EL device of Inventive Example 2, the relationship between the thickness of the hole transporting layer 4 composed of NPB and the number of defective pixels was examined. FIG. 7 and Table 7 show the relationship between the thickness of the hole transporting layer 4 composed of NPB and the number of defective pixels in the device of Inventive Example 2.

The number of pixels contained in the whole panel is 400×300×3(RGB)=360000. In order to measure the number of defective pixels per panel, five types of organic EL devices, each having a different thickness of the hole transporting layer 4 composed of NPB were fabricated under the same conditions as those of Inventive Example 2. The "defective pixels" herein represent non-emitting pixels due to a short circuit (pixels to be black spots).

TABLE 7

| NPB film thickness (Å) | the number of defective pixels/panel |
|---|---|
| 500 | 54 |
| 800 | 48 |
| 1500 | 24 |
| 1800 | 10 |
| 2300 | 8 |

FIG. 7 and Table 7 show that the number of defective pixels was decreased as the thickness of NPB is increased. In particular, the number of defective pixels was decreased to not more than 25 with the thickness of NPB being not less than 1500 Å. Conversely, the number of defective pixels was in excess of 50 with the thickness of NPB being not more than 500 Å. Namely, as the thickness of the hole transporting layer 4 is increased, a further improved yield can be attained.

Accordingly, it is found that the organic EL devices of Inventive Examples 1–5, and Comparative Example 2 provide a high yield, whereas that of Comparative Example 1 provides a low yield.

Figure 8:
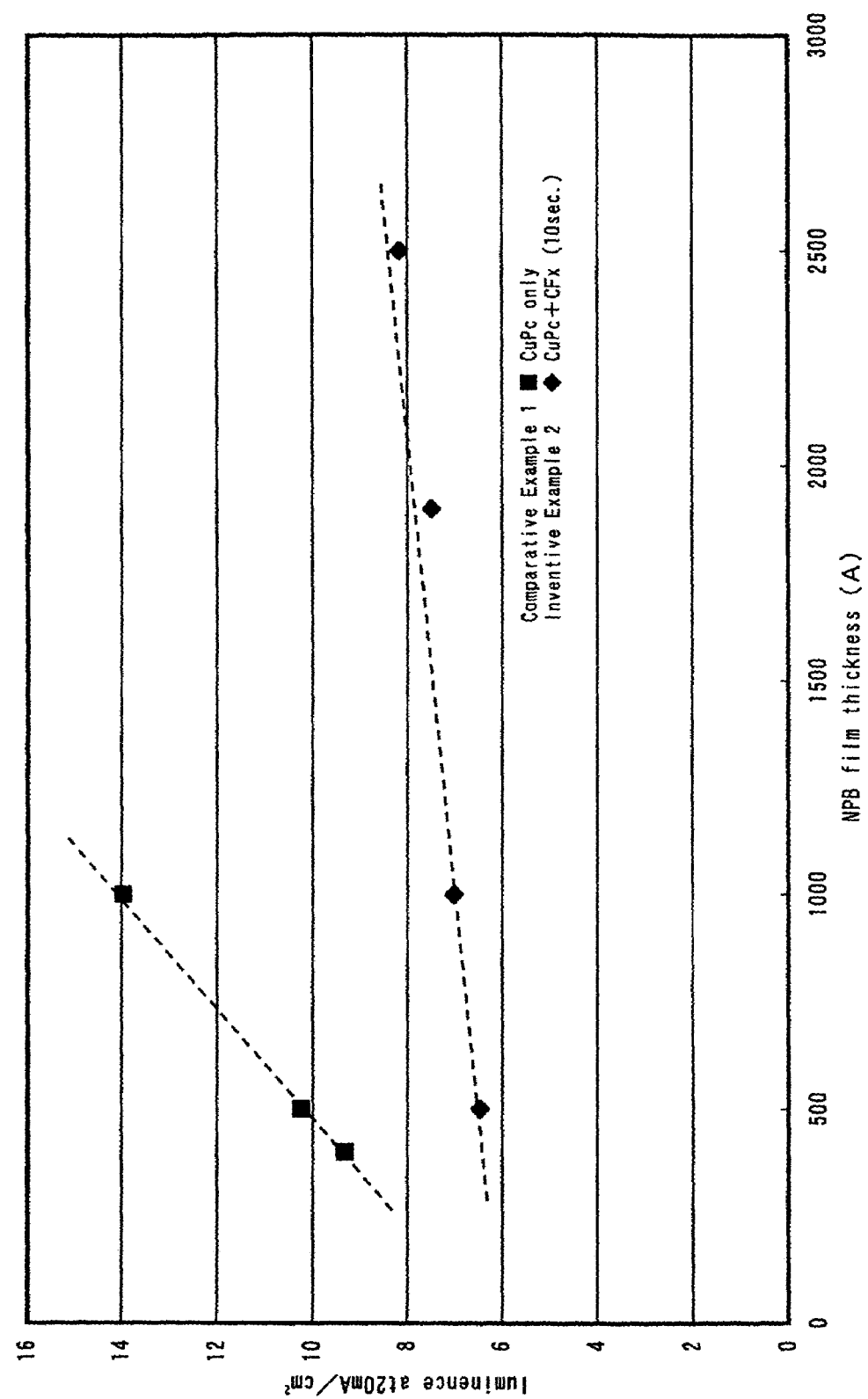
FIG. 8 is a diagram showing the relationships between the thickness of the hole transporting layer of NPB and initial drive voltages in the organic EL devices of Inventive Example 2 and Comparative Example 1.

With the organic EL devices of Inventive Example 2 and Comparative Example 1, the relationships between the thickness of the hole transporting layer 4 composed of NPB and the drive voltage were examined. Organic EL devices, each having a different thickness of the transport layer 4 were fabricated under the conditions of Inventive Example 2 and Comparative Example 1 to measure the initial drive voltages. FIG. 8, Table 8 and Table 9 show the relationships between the thickness of the hole transport layer 4 composed of NPB and the initial drive voltages in Inventive Example 2 and Comparative Example 1.

TABLE 8

| CuPc + CFx (CFx 10 sec.) | |
|---|---|
| NPB film thickness (Å) | initial driving voltage (V) |
| 500 | 6.46 |
| 1000 | 7.01 |
| 1900 | 7.49 |
| 2500 | 8.17 |

TABLE 9

| CuPc | |
|---|---|
| NPB film thickness (Å) | initial driving voltage (V) |
| 400 | 9.32 |
| 500 | 10.24 |
| 1000 | 13.96 |

As shown in FIG. 8 and Table 8, in the organic EL device of Inventive Example 2, the drive voltage was kept as small as about 8 volts even when the thickness of NPB was increased to 2500 Å. As shown in FIG. 8 and Table 9, on the other hand, in the organic EL device of Comparative Example 1, the drive voltage was as large as about 9 volts even when the thickness of NPB was decreased to 400 Å. Namely, in the organic EL device of Inventive Example 2, it is possible to increase the thickness of the hole transport layer 4 of NPB while keeping the drive voltage low by forming the hole injecting layer 3 of CuPc and the plasma thin film 8 of $CF_x$. Accordingly, an improved yield can be attained.

Finally, analysis on the plasma thin film of $CF_x$ was conducted. A $CF_x$ film was deposited on an ITO film under the conditions of a pressure of 7 Pa, a $CHF_3$ gas flow rate of 100 sccm, a RF power of 100 W, and a deposition time of 10 seconds.

Table 10 shows the result of measurement of the plasma thin film of $CF_x$ by XPS (X-ray photoelectron spectroscopy).

TABLE 10

<C1s peak separation results> XPS intensity (unit: %)

| point of measurement | C—C, CH | C—CFx | CF | CF$_2$ | CF$_3$ | |
|---|---|---|---|---|---|---|
| 1A | 37.0 | 22.0 | 19.0 | 12.0 | 10.0 | |
| 1D | 34.0 | 24.0 | 19.0 | 13.0 | 10.0 | |
| 1H | 37.0 | 22.0 | 19.0 | 12.0 | 9.7 | |
| 3C | 31.0 | 28.0 | 18.0 | 13.0 | 9.6 | |
| 3F | 33.0 | 24.0 | 20.0 | 13.0 | 10.0 | |
| 6A | 35.0 | 24.0 | 19.0 | 12.0 | 9.7 | |
| 6D | 37.0 | 24.0 | 18.0 | 12.0 | 9.2 | |
| 6H | 39.0 | 26.0 | 16.0 | 11.0 | 7.9 | |
| 9B | 29.0 | 25.0 | 21.0 | 14.0 | 11.0 | |
| 9G | 38.0 | 25.0 | 17.0 | 12.0 | 8.1 | |
| 10A | 31.0 | 25.0 | 20.0 | 14.0 | 10.0 | |
| 10D | 35.0 | 25.0 | 19.0 | 12.0 | 9.3 | |
| 10H | 33.0 | 22.0 | 20.0 | 14.0 | 11.0 | |
| average | 34.5 | 24.3 | 18.8 | 12.6 | 9.7 | 100.0 |

In Table 10, the ordinate shows point of measurement, and the abscissa shows C1s peak intensity based on C—C, CH, C—CF$_x$, CF, CF$_2$, and CF$_3$. The peak intensity based on C—C and CH is 34.5% on average, the peak intensity based on C—CF$_x$ is 24.3% on average, the peak intensity based on CF is 18.8% on average, the peak intensity based on CF$_2$ is 12.6% on average, and the peak intensity based on CF$_3$ is 9.7% on average. The result shows that the plasma thin film of CF$_x$ includes CF, CF$_2$, and CF$_3$.

Furthermore, analysis on the composition ratio of elements was conducted by atomic force microscope (AFM), the result of which is shown in Table 11.

TABLE 11

<composition ratio of elements> (unit: at. %)

| point of measurement | C | O | F | In | Sn | |
|---|---|---|---|---|---|---|
| 1A | 32.0 | 22.0 | 31.0 | 14.0 | 1.4 | |
| 1D | 30.0 | 24.0 | 29.0 | 15.0 | 1.6 | |
| 1H | 32.0 | 22.0 | 30.0 | 14.0 | 1.5 | |
| 3C | 29.0 | 24.0 | 29.0 | 16.0 | 1.7 | |
| 3F | 29.0 | 24.0 | 29.0 | 16.0 | 1.7 | |
| 6A | 30.0 | 24.0 | 29.0 | 15.0 | 1.6 | |
| 6D | 28.0 | 25.0 | 28.0 | 17.0 | 1.8 | |
| 6H | 30.0 | 24.0 | 27.0 | 17.0 | 1.7 | |
| 9B | 28.0 | 24.0 | 31.0 | 15.0 | 2.1 | |
| 9G | 31.0 | 23.0 | 29.0 | 15.0 | 1.5 | |
| 10A | 30.0 | 23.0 | 31.0 | 14.0 | 1.5 | |
| 10D | 29.0 | 25.0 | 29.0 | 15.0 | 1.6 | |
| 10H | 28.0 | 24.0 | 31.0 | 15.0 | 1.6 | |
| average | 29.7 | 23.7 | 29.5 | 15.2 | 1.6 | 99.7 |

In Table 11, the ordinate shows point of measurement, and the abscissa shows the composition ratio (at. %) of the elements, i.e., C, O, F, In, and Sn. Table 11 shows that C is 29.7 at. % on average, and F is 29.5 at. % on average. O, In, and Sn herein are derived from the ITO film.

The results of Inventive Examples described hereinabove show that it becomes possible to keep the drive voltage low, and lower the power consumption by interposing the hole injecting layer 3 composed of CuPc between the hole injecting electrode 2 and the hole transporting layer 4, and forming the plasma thin film of CF$_x$ between the hole injecting layer 3 and the hole injecting layer 4. It also becomes possible to increase the heat-resistance (reliability at high temperature) and the life time while decreasing the number of defective pixels to attain an improved yield.

It should be noted here that the thickness of plasma thin film 8 of CF$_x$ is preferably not less than 5 Å nor more than 50 Å, more preferably not less than 5 Å nor more than 24 Å and still more preferably not less than 5 Å nor more than 12 Å.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent device comprising a hole injecting electrode, a hole injecting layer, a hole transporting layer, a light emitting layer, and an electron injecting electrode in this order,
    said device further comprising a thin film formed by plasma deposit on a surface of said hole injecting layer on the side of said light emitting layer, said thin film located between the hole injection layer and the hole transporting layer, wherein
    said thin film is formed of a material selected from the group consisting of carbon based material, silicon based material, silicon carbide based material, and cadmium sulfide based material.

2. The organic electroluminescent device according to claim 1, wherein said thin film is formed of a crystalline or non-crystalline material.

3. The organic electroluminescent device according to claim 1, wherein said thin film is formed of halide.

4. The organic electroluminescent device according to claim 1, wherein said thin film is formed of carbon based halide.

5. The organic electroluminescent device according to claim 1, wherein said thin film is formed of fluorocarbon.

6. The organic electroluminescent device according to claim 1, wherein said hole injecting layer is formed of a material selected from the group consisting of a phthalocyanine compound, porphyrin compound, amine based material, polyaniline based material, polythiophene based material, and polypyrrole based material.

7. The organic electroluminescent device according to claim 1, wherein the thickness of said thin film is not less than 5 Å nor more than 50 Å.

8. The organic electroluminescent device according to claim 1, wherein said thickness of said thin film is not less than 5 Å nor more than 12 Å.

9. The organic electroluminescent device according to claim 1, wherein said hole injecting layer is formed of copper phthalocyanine, and said thin film is formed of fluorocarbon.

* * * * *